United States Patent
Isobe et al.

(10) Patent No.: US 10,531,566 B2
(45) Date of Patent: Jan. 7, 2020

(54) GLASS SUBSTRATE

(71) Applicant: AGC Inc., Chiyoda-ku (JP)

(72) Inventors: Mamoru Isobe, Chiyoda-ku (JP); Motoshi Ono, Chiyoda-ku (JP); Shigetoshi Mori, Chiyoda-ku (JP); Kohei Horiuchi, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/030,216

(22) Filed: Jul. 9, 2018

(65) Prior Publication Data

US 2019/0021170 A1    Jan. 17, 2019

(30) Foreign Application Priority Data

Jul. 11, 2017  (JP) ................. 2017-135755

(51) Int. Cl.
| | |
|---|---|
| *H05K 1/11* | (2006.01) |
| *H05K 1/03* | (2006.01) |
| *H05K 3/00* | (2006.01) |
| *B23K 26/046* | (2014.01) |
| *B23K 26/064* | (2014.01) |
| *B23K 26/382* | (2014.01) |
| *B23K 26/402* | (2014.01) |
| *B23K 26/142* | (2014.01) |

(52) U.S. Cl.
CPC ......... *H05K 3/0029* (2013.01); *B23K 26/046* (2013.01); *B23K 26/064* (2015.10); *B23K 26/142* (2015.10); *B23K 26/382* (2015.10); *B23K 26/402* (2013.01); *H05K 1/0306* (2013.01); *H05K 1/115* (2013.01); *H05K 3/0055* (2013.01); *H05K 2201/09563* (2013.01); *H05K 2201/09827* (2013.01); *H05K 2201/09854* (2013.01); *H05K 2203/081* (2013.01); *H05K 2203/107* (2013.01)

(58) Field of Classification Search
CPC ............................ H05K 1/115; H05K 1/0306
See application file for complete search history.

(56) References Cited

U.S. PATENT DOCUMENTS

2002/0180027 A1* 12/2002 Yamaguchi ........... H01L 21/486
                                                        257/700

* cited by examiner

*Primary Examiner* — Jeremy C Norris
(74) *Attorney, Agent, or Firm* — Oblon, McClelland, Maier & Neustadt, L.L.P.

(57) ABSTRACT

A glass substrate includes a first surface and a second surface that are opposite to each other. Multiple through holes pierce through the glass substrate from the first surface to the second surface. Each of five through holes randomly selected from the multiple through holes includes a first opening at the first surface and a second opening at the second surface. The approximate circle of the first opening has a diameter greater than a diameter of the approximate circle of the second opening. The first opening has a roundness of 5 μm or less. Perpendicularity expressed by $P=t_c/t_0$ ranges from 1.00000 to 1.00015, where P is the perpendicularity, $t_c$ is the distance between the center of the approximate circle of the first opening and the center of the approximate circle of the second opening, and $t_0$ is the thickness of the glass substrate.

17 Claims, 3 Drawing Sheets

GLASS SUBSTRATE

CROSS-REFERENCE TO RELATED APPLICATION

This application is based upon and claims priority to Japanese Patent Application No. 2017-135755, filed on Jul. 11, 2017, the entire contents of which are incorporated herein by reference.

BACKGROUND OF THE INVENTION

1. Field of the Invention

The present invention relates to glass substrates.

2. Description of the Related Art

Conventionally, glass substrates having through holes are widely used for a variety of devices. For example, a glass substrate having through holes filled with an electrically conductive material is used as a glass interposer.

SUMMARY OF THE INVENTION

According to an aspect of the present invention, a glass substrate includes a first surface and a second surface that are opposite to each other. Multiple through holes pierce through the glass substrate from the first surface to the second surface. Each of five through holes randomly selected from the multiple through holes includes a first opening at the first surface and a second opening at the second surface. The approximate circle of the first opening has a diameter greater than a diameter of the approximate circle of the second opening. The first opening has a roundness of 5 μm or less. Perpendicularity expressed by $P=t_c/t_0$ ranges from 1.00000 to 1.00015, where P is the perpendicularity, $t_c$ is the distance between the center of the approximate circle of the first opening and the center of the approximate circle of the second opening, and $t_0$ is the thickness of the glass substrate.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

As devices become more sophisticated, components, as exemplified by substrates including through vias, such as glass interposers, are expected to be required of higher dimensional accuracy.

For example, in the case of glass substrates having through holes, a slight change in the shape of a through hole may affect not only the filling of an electrically conductive material but also device characteristics. Therefore, it is desirable to form through holes of a predetermined shape with high dimensional accuracy in a glass substrate applied to a device as a basic component, to enable the device to fully demonstrate its characteristics.

According to an aspect of the present invention, it is possible to provide a glass substrate having through holes that is fully applicable to future highly-sophisticated devices.

One or more embodiments are described below with reference to the accompanying drawings.

Figure 1:
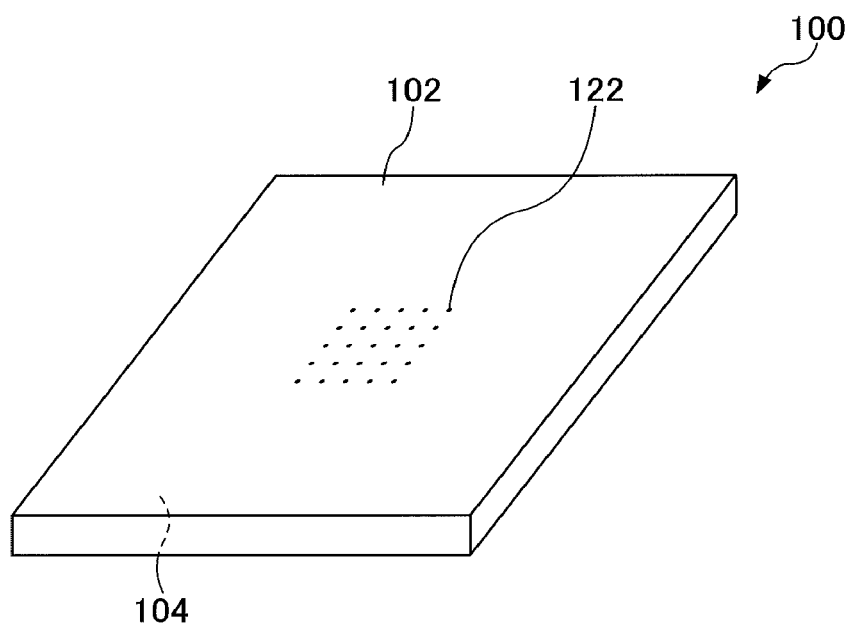
FIG. 1 is a schematic perspective view of a glass substrate according to an embodiment of the present invention.

FIG. 1 is a schematic diagram illustrating a glass substrate having through holes (hereinafter referred to as "first glass substrate") according to an embodiment of the present invention.

Referring to FIG. 1, a first glass substrate 100 includes a first surface 102 and a second surface 104 that are opposite to each other. Furthermore, multiple through holes 122 pierce through the first glass substrate 100 from the first surface 102 to the second surface 104.

The first glass substrate 100, which has a substantially rectangular shape by way of example in the illustration of FIG. 1, is not limited to a particular shape.

Furthermore, the through holes 122, which are positioned substantially in the center of the first glass substrate 100 in the illustration of FIG. 1, are not limited to a particular position. For example, the through holes 122 may be positioned near the substantial corners of the first glass substrate 100 in addition to or instead of being positioned substantially in the center of the first glass substrate 100. Furthermore, the through holes 122 may be positioned evenly (at equal intervals) or be positioned irregularly (at different intervals and/or in different patterns).

Figure 2:
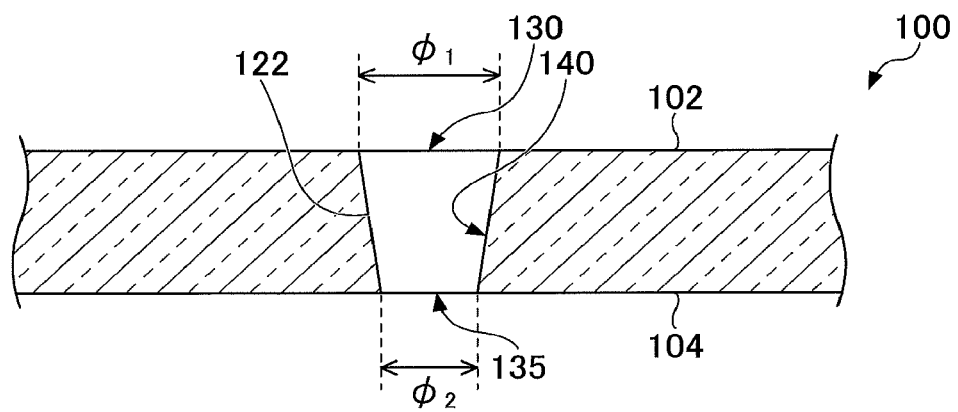
FIG. 2 is a schematic sectional view of the glass substrate, illustrating one of through holes provided in the glass substrate, according to the embodiment of the present invention.

FIG. 2 is a schematic sectional view of the first glass substrate 100, illustrating one of the through holes 122 provided in the first glass substrate 100.

Referring to FIG. 2, the through hole 122 is defined by a first opening 130 and a second opening 135 formed at the first surface 102 and the second surface 104, respectively, of the first glass substrate 100 and a sidewall 140.

The first opening 130 and the second opening 135 preferably have a substantially circular shape (including a substantially elliptical shape).

Here, the first opening 130 is approximated to a "first approximate circle" having a diameter $\varphi_1$. Likewise, the second opening 135 is approximated to a "second approximate circle" having a diameter $\varphi_2$. As illustrated in FIG. 2, the through hole 122 is tapered downward. Accordingly, $\varphi_1$ is greater than $\varphi_2$ ($\varphi_1 > \varphi_2$).

The method of determining the first and the second approximate circle is described below.

Figure 3:
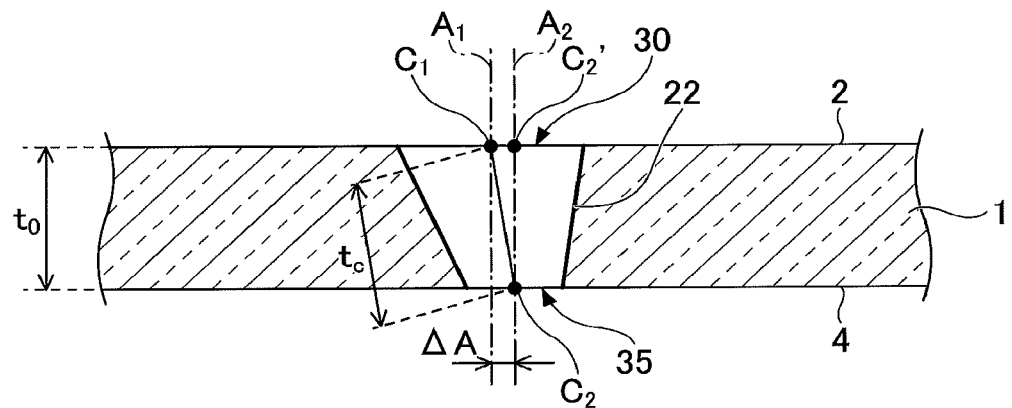
FIG. 3 is a schematic sectional view of a through hole for illustrating the perpendicularity of a through hole.
Figure 4:
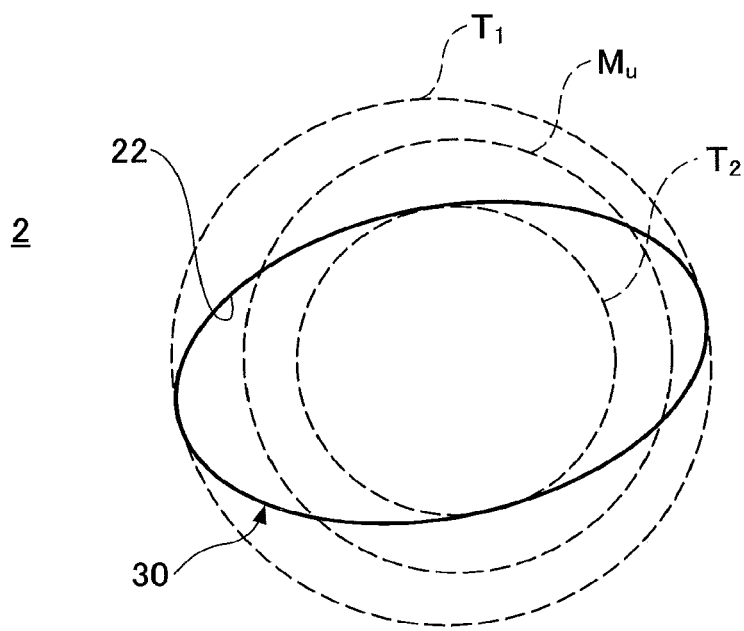
FIG. 4 is a schematic plan view of a through hole for illustrating the roundness of a through hole.

Here, to describe shape features of the through holes 122 provided in the first glass substrate 100, the definitions of the terms "perpendicularity" and "roundness" used in the specification are given with reference to FIGS. 3 and 4.

FIG. 3 is a schematic sectional view of a through hole for illustrating the "perpendicularity" of a through hole. FIG. 4 is a schematic plan view of a through hole for illustrating the "roundness" of a through hole.

Referring to FIG. 3, a glass substrate 1 includes a first surface 2 and a second surface 4. A through hole 22 pierces through the glass substrate 1. The through hole 22 is defined by a first opening 30 at the first surface 2 and a second opening 35 at the second surface 4.

The first opening 30 has a center $C_1$. The second opening 35 has a center $C_2$. A perpendicular line extending from the center $C_1$ of the first opening 30 in a direction of the thickness of the glass substrate 1 is referred to "first central axis $A_1$." A perpendicular line extending from the center $C_2$ of the second opening 35 in a direction of the thickness of the glass substrate 1 is referred to "second central axis $A_2$."

The center $C_1$ of the first opening 30 may be determined from the first approximate circle $M_u$ of the first opening 30 as the center of the first approximate circle $M_u$. Likewise, the center $C_2$ of the second opening 35 may be determined from the second approximate circle $M_b$ of the second opening 35 as the center of the second approximate circle $M_b$. The first approximate circle $M_u$ of the first opening 30 is illustrated in FIG. 4 for reference.

The first approximate circle $M_u$ and its center $C_1$ may be determined using an image measurement system (for example, a NIKON NEXIV video measuring system). The camera of an image measurement system is focused on the first surface 2 to capture an image of the first opening 30 of the through hole 22. The first approximate circle $M_u$ of the first opening 30 and its center $C_1$ can be automatically determined from the image of the first opening 30. Likewise, the second approximate circle $M_b$ of the second opening 35 and its center $C_2$ can be determined using an image measurement system.

The diameter $\varphi_1$ of the first approximate circle $M_u$ of the first opening 30 can be automatically determined from the first approximate circle $M_u$ determined by the above-described image measurement system. The diameter $\varphi_2$ of the second approximate circle $M_b$ can be likewise automatically determined.

Referring to FIG. 3, letting the thickness of the glass substrate 1 be $t_0$ and letting the distance between the center $C_1$ and the center $C_2$ be $t_c$, the perpendicularity P of the through hole 22 is determined by:

$$P = t_c/t_0. \quad (1)$$

According to this definition, the perpendicularity P is 1 (P=1) when the first central axis $A_1$ coincides with the second central axis $A_2$, namely, when the center $C_1$ and the center $C_2$ are on the same axis.

The distance $t_c$ may be determined by:

$$t_c = \sqrt{((t_0)^2 + (\Delta A)^2)}. \quad (2)$$

Here, $t_0$ is the thickness of the glass substrate 1. The method of measuring $t_0$ is not limited to a particular method as long as the method can measure the thickness of a glass substrate. For example, $t_0$ may be measured using a laser displacement sensor.

Furthermore, $\Delta A$ is the distance between the center $C_1$ and an intersection point $C_2'$ of the second central axis $A_2$ passing through the center $C_2$ and the first surface 2 as illustrated in FIG. 3.

The distance $\Delta A$ may be determined using an image measurement system (for example, a NIKON NEXIV video measuring system). The camera of an image measurement system is focused on the second surface 4 to capture an image of the second opening 35 of the through hole 22. The second approximate circle $M_b$ of the second opening 35 and its center $C_2$ (the coordinates of the center $C_2$) are automatically determined.

Next, the focus of the camera of the image measurement system is moved in a direction perpendicular to the second surface 4 (a direction of the thickness of the glass substrate 1). The camera of the image measurement system is focused on the first surface 2 to capture an image of the first opening 30 of the through hole 22. The first approximate circle $M_u$ of the first opening 30 and its center $C_1$ (the coordinates of the center $C_1$) are automatically determined.

The distance $\Delta A$ can be automatically calculated from the second approximate circle $M_b$ of the second opening 35 and the coordinates of its center $C_2$ and the first approximate circle $M_u$ of the first opening 30 and the coordinates of its center $C_1$, using an image measurement system.

As illustrated in FIG. 4, the through hole 22 has the first opening 30 at the first surface 2 of the glass substrate 1. In this illustration, the first opening 30 has a substantially elliptical shape. The first opening 30, however, is not limited this shape.

Referring to FIG. 4, $T_1$ and $T_2$ indicate the circumscribed circle and the inscribed circle, respectively, of the first opening 30.

In this case, the roundness $U_u$ of the first opening 30 is determined by:

$$U_u = R_1 - R_2, \quad (3)$$

where $R_1$ is the radius of the circumscribed circle $T_1$ and $R_2$ is the radius of the inscribed circle $T_2$.

According to this definition, the roundness $U_u$ is zero ($U_u=0$) when the circumscribed circle $T_1$ coincides with the inscribed circle $T_2$.

The roundness $U_b$ of the second opening 35 of the through hole 22 can be likewise determined.

The circumscribed circle $T_1$ and the inscribed circle $T_2$ of the first opening 30 may be determined using an image measurement system (for example, a NIKON NEXIV video measuring system). The camera of an image measurement system is focused on the first surface 2 to capture an image of the first opening 30 of the through hole 22. The circumscribed circle $T_1$ and the inscribed circle $T_2$ of the first opening 30 can be automatically determined from the image of the first opening 30. Likewise, the circumscribed circle and the inscribed circle of the second opening 35 can be determined using an image measurement system.

While the single through hole 22 is illustrated in FIGS. 3 and 4, multiple through holes 22 may be formed in the glass substrate 1. In this case, one through hole 22 is arbitrarily selected from the multiple through holes 22. The approximate circle, center, circumscribed circle, and inscribed circle of the first opening and the approximate circle, center, circumscribed circle, and inscribed circle of the second opening may be determined as described above with respect to the selected through hole 22.

Here, with respect to the first glass substrate 100, five through holes 122 are randomly selected from the through holes 122. The selected through holes 122 are referred to as "selected through holes." In this case, each of the selected through holes has the following features:
(a) the roundness $U_u$ of the first opening is 5 μm or less ($U_u \leq 5$ μm); and
(b) the perpendicularity P ranges from 1.00000 to 1.00015 ($1.00000 \leq P \leq 1.00015$).

According to the first glass substrate 100, the shape features of the selected through holes are thus significantly uniform. Accordingly, when the first glass substrate 100 is applied to a device such as a glass substrate including through vias (for example, a glass interposer), the degradation of device characteristics due to shape factors is significantly reduced, so that the device can fully demonstrate characteristics expected of the device.

Therefore, the first glass substrate 100 is fully applicable to highly-sophisticated devices.

Next, other features of the first glass substrate 100 are described.

A glass substrate used for the first glass substrate 100 is not limited to a particular composition. The glass substrate may be of, for example, soda-lime glass, alkali-free glass, quartz, or photosensitive glass.

The thickness of the glass substrate is not limited in particular, and may be in the range of, for example, 0.05 mm to 0.7 mm.

As noted above, the selected through holes have the following features:

(a) the roundness $U_u$ of the first opening 130 is 5 μm or less; and (b) the perpendicularity P ranges from 1.00000 to 1.00015.

Approximately 80% or more, for example, 90% or more, of all the through holes 122 provided in the first glass substrate 100 may have the above-described features (a) and (b).

Furthermore, the selected through holes may have the feature that (c) the roundness $U_b$ of the second opening 135 is 5 μm or less.

In particular, approximately 80% or more, for example, 90% or more, of all the through holes 122 provided in the first glass substrate 100 may have the above-described feature (c).

With respect to the through holes 122, the diameter $\varphi_1$ of the first approximate circle $M_u$ of the first opening 130 is in the range of, for example, 20 μm to 160 μm, and preferably, in the range of 40 μm to 100 μm. The diameter $\varphi_2$ of the second approximate circle $M_b$ of the second opening 135 is in the range of, for example, 10 μm to 150 μm, and preferably, in the range of 30 μm to 90 μm.

As is clear from the above description, the first opening 130 and the second opening 135 do not necessarily have to have a substantially circular shape (including a substantially elliptical shape). For example, one or both of the first opening 130 and the second opening 135 may have a noncircular shape.

Next, a method of producing a glass substrate having the above-described features according to an embodiment is described.

Figure 5:
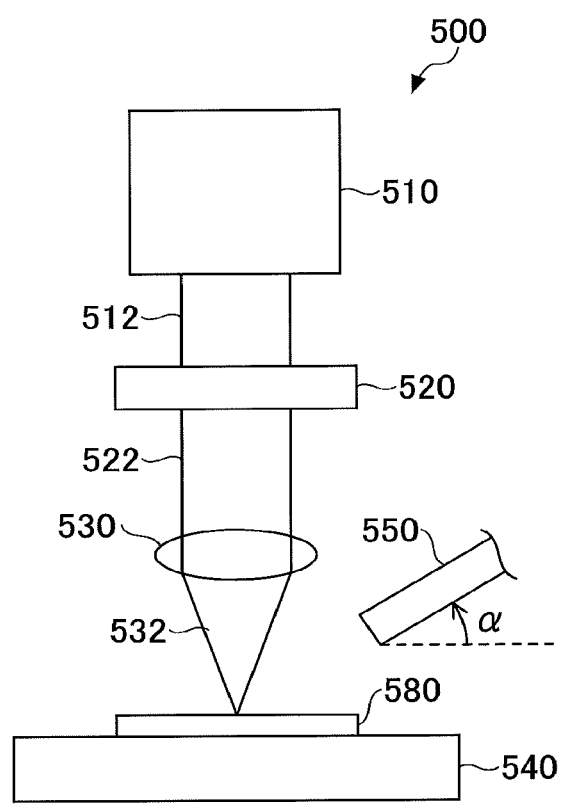
FIG. 5 is a schematic diagram illustrating an apparatus that may be used for a method of producing a glass substrate according to an embodiment of the present invention.

FIG. 5 is a schematic diagram illustrating an apparatus that may be used for a method of producing a glass substrate according to an embodiment of the present invention (hereinafter referred to as "first production method").

Referring to FIG. 5, an apparatus 500 includes a laser source 510, a waveplate 520, a lens system 530, a stage 540, and a blower 550.

Examples of the laser source 510 include a $CO_2$ laser source and a YAG laser source.

The lens system 530 includes, for example, one or more lenses. The lens system 530 focuses a laser beam 522 exiting from the waveplate 520 onto an object to be processed ("object") 580 set on the stage 540.

To form a through hole in the object 580 using the apparatus 500 as described above, first, the object 580 is placed on the stage 540. The stage 540 is moved horizontally and/or vertically to place the object 580 at a predetermined position.

Next, a laser beam 512 is emitted toward the waveplate 520 from the laser source 510. The laser beam 512 exits from the waveplate 520 as the laser beam 522. Thereafter, the laser beam 522 is converged into a laser beam 532 by the lens system 530. The laser beam 532 focuses on a position where a through hole is to be formed in the object 580, so that a through hole is formed at the position.

Multiple through holes may be formed in the object 580 by repeatedly performing the above-described process.

According to conventional laser processing methods, during formation of a through hole, namely, at the stage where a deep hole is gradually formed in the object 580 by emitting a laser beam onto the object 580, the energy intensity distribution of the laser beam in a cross section perpendicular to the depth direction of the hole is not necessarily uniform.

This is because the laser beam is linearly polarized. That is, in general, in the case of a linearly polarized laser beam, the behavior of laser absorption and reflection at the inner wall (inner circumferential surface) of a hole is highly dependent on the relationship between the direction of oscillation of the laser beam and an angle at which the laser beam is emitted onto the wall surface. Therefore, the behavior of absorption and reflection of the linearly polarized laser beam varies greatly depending on a position on the wall surface.

Accordingly, in the case of footling a through hole in the object 580 by emitting a linearly polarized laser beam onto the object 580, the through hole is likely to have a cross-sectional shape that differs greatly from a true circle because of the non-uniform energy intensity distribution of the laser beam. For the same reason, the extension axis of the through hole is likely to be inclined relative to a vertical direction.

Furthermore, according to conventional laser processing methods, a hole is filled with gas, debris, plasma, etc., (hereinafter collectively referred to as "filling matter") during formation of a through hole.

Therefore, the energy intensity of a laser beam emitted into the hole is unevenly decayed by this filling matter. In other words, the energy intensity of the laser beam varies greatly across spatial positions in the hole. In particular, the energy intensity of the laser beam decays more as a position from a surface becomes deeper. Because of this, the shape of a through hole is more likely to differ from a desired shape.

Thus, according to conventional laser processing methods, it is difficult to form a through hole having a desired shape with high accuracy.

For example, in the obtained through hole, the offset between the positions of the first central axis $A_1$ of the first opening and the second central axis $A_2$ of the second opening (see ΔA in FIG. 3) increases, or the roundness $U_u$ of the first opening and the roundness $U_b$ of the second opening degrade.

In contrast, according to the first production method, the apparatus 500 includes the waveplate 520. The waveplate 520 circularly polarizes the laser beam 512 emitted from the laser source 510. Accordingly, the laser beam 522 exiting from the waveplate 520 after entry of the laser beam 512 into the waveplate 520 is circularly polarized. This circularly polarized laser beam 522 passes through the lens system 530 to be emitted onto the object 580 as the laser beam 532.

This circularly polarized laser beam 532 is less likely to have the above-described adverse effect of a linearly polarized laser beam. Thus, according to the first production method, compared with a linearly polarized laser beam, a laser beam having a uniform energy intensity distribution can be emitted onto a position where a through hole is to be formed.

Furthermore, the apparatus 500 includes the blower 550. The blower 550 is configured to blow gas into an area to be exposed to the laser beam 532 in the object 580. Accordingly, it is possible to clear a hole of filling matter with the gas.

Therefore, according to the first production method, a hole is significantly less likely to be filled with filling matter during the processing of the object 580, and can be relatively evenly exposed to a laser beam to its deepest part.

As a result, according to the first production method, it is possible to form a through hole having good perpendicularity P and good roundness $U_u$ and $U_b$.

Here, the tip of the blower 550 is preferably inclined at an angle α of 30° to 60°, more preferably, 40° to 55°, to a horizontal plane. Furthermore, the tip of the blower 550 is preferably at a vertical distance of 10 mm to 30 mm, more preferably, 15 mm to 25 mm, from the surface of the object 580.

In this case, during hole processing, it is possible to more reliably clear a hole of filling matter. Accordingly, it is possible to form a through hole having a desired shape with higher accuracy.

By the above-described process, it is possible to form a through hole in the object 580. Thereafter, etching may be further performed on the object 580 in which a through hole is formed. Furthermore, thermal treatment may be performed on the object 580 before etching.

A glass substrate having through holes having the above-described shape features can be formed through the process as described above.

The through holes may be thereafter filled with an electrically conductive material.

Next, an example according to the present invention is described.

EXAMPLE

Through holes were formed in a glass substrate using an apparatus as illustrated in FIG. 5.

An alkali-free glass substrate of 0.4 mm in thickness was used as a glass substrate.

A $CO_2$ laser source was used as a laser source. A ZnSe waveplate was used as a waveplate. A blower was installed with its tip angled at approximately 45° to a horizontal plane so as to feed air to a position where a through hole is to be formed. The height of the tip of the blower from the surface of the glass substrate was 25 mm.

Two hundred through holes were formed in the glass substrate at a laser power of 9 W.

The target diameter of the first opening and the target diameter of the second opening of each through hole were 75 μm and 30 μm, respectively.

Comparative Example

Through holes were formed in a glass substrate in the same manner as in Example. According to Comparative Example, however, hole processing was performed without a blower.

[Evaluation]

Dimensions of the through holes were evaluated using the glass substrates obtained in Example and Comparative Example. Specifically, the diameter and the roundness $U_u$ of the first approximate circle $M_u$ of the first opening, the diameter and the roundness $U_b$ of the second approximate circle $M_b$ of the second opening, and the perpendicularity P were measured with respect to the through holes.

The evaluation results are collectively shown in TABLE 1 below.

TABLE 1

| | FIRST OPENING | | SECOND OPENING | |
| --- | --- | --- | --- | --- |
| | AVERAGE DIAMETER OF FIRST APPROXIMATE CIRCLE $M_u$ (μm) | MAXIMUM ROUNDNESS $U_u$ (μm) | AVERAGE DIAMETER OF SECOND APPROXIMATE CIRCLE $M_b$ (μm) | MAXIMUM ROUNDNESS $U_b$ (μm) |
| EXAMPLE | 75.5 | 4.0 | 33.8 | 2.6 |
| COMPARATIVE EXAMPLE | 74.9 | 7.1 | 31.4 | 5.1 |

| | MAXIMUM PERPENDICULARITY P |
| --- | --- |
| EXAMPLE | 1.00014 |
| COMPARATIVE EXAMPLE | 1.00250 |

In TABLE 1, the diameter of each of the first approximate circle $M_u$ and the second approximate circle $M_b$ is the average of the diameters of the 200 through holes. Furthermore, each of the roundness $U_u$, the roundness $U_b$, and the perpendicularity P is the maximum of the corresponding values of the 200 through holes.

Referring to TABLE 1, according to Comparative Example, the maximum roundness $U_u$ of the first opening is 7.1 μm, the maximum roundness $U_b$ of the second opening is 5.1 μm, and the perpendicularity P is 1.00250.

In contrast, according to Example, the maximum roundness $U_u$ of the first opening is 4.0 μm, the maximum roundness $U_b$ of the second opening is 2.6 μm, and the perpendicularity P is 1.00014.

Thus, it is found that the through holes formed in Example satisfy the above-described conditions (a) and (b).

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A glass substrate comprising:
a first surface and a second surface that are opposite to each other with a plurality of through holes piercing through the glass substrate from the first surface to the second surface,
wherein each of five through holes randomly selected from the plurality of through holes includes a first opening at the first surface and a second opening at the second surface,
an approximate circle of the first opening has a diameter greater than a diameter of an approximate circle of the second opening,
the first opening has a roundness of 5 μm or less, and
a perpendicularity expressed by $P=t_c/t_0$ ranges from 1.00000 to 1.00015, where P is the perpendicularity, $t_c$ is a distance between a center of the approximate circle of the first opening and a center of the approximate circle of the second opening, and $t_0$ is a thickness of the glass substrate.

2. The glass substrate as claimed in claim 1, wherein the first opening has a substantially circular shape, and the diameter of the approximate circle of the first opening ranges from 20 μm to 160 μm.

3. The glass substrate as claimed in claim 2, wherein the second opening has a substantially circular shape, and the diameter of the approximate circle of the second opening ranges from 10 μm to 150 μm.

4. The glass substrate as claimed in claim 3, wherein t0 ranges from 0.05 mm to 0.7 mm.

5. The glass substrate as claimed in claim 4, wherein at least one of the plurality of through holes is filled with an electrically conductive material.

6. The glass substrate as claimed in claim 3, wherein at least one of the plurality of through holes is filled with an electrically conductive material.

7. The glass substrate as claimed in claim 2, wherein $t_0$ ranges from 0.05 mm to 0.7 mm.

8. The glass substrate as claimed in claim 7, wherein at least one of the plurality of through holes is filled with an electrically conductive material.

9. The glass substrate as claimed in claim 2, wherein at least one of the plurality of through holes is filled with an electrically conductive material.

10. The glass substrate as claimed in claim 1, wherein the second opening has a substantially circular shape, and the diameter of the approximate circle of the second opening ranges from 10 μm to 150 μm.

11. The glass substrate as claimed in claim 10, wherein $t_0$ ranges from 0.05 mm to 0.7 mm.

12. The glass substrate as claimed in claim 11, wherein at least one of the plurality of through holes is filled with an electrically conductive material.

13. The glass substrate as claimed in claim 10, wherein at least one of the plurality of through holes is filled with an electrically conductive material.

14. The glass substrate as claimed in claim 1, wherein $t_0$ ranges from 0.05 mm to 0.7 mm.

15. The glass substrate as claimed in claim 14, wherein at least one of the plurality of through holes is filled with an electrically conductive material.

16. The glass substrate as claimed in claim 1, wherein at least one of the plurality of through holes is filled with an electrically conductive material.

17. The glass substrate as claimed in claim 1, wherein the diameter of the approximate circle of the first opening ranges from 40 μm to 100 μm.

* * * * *